United States Patent
Lan (10) Patent No.: US 11,804,830 B2
(45) Date of Patent: Oct. 31, 2023

(54) CLOCK FILTER DEVICE, CLOCK FILTER AND PULSE GENERATOR

(71) Applicant: NUVOTON TECHNOLOGY CORPORATION, Hsinchu (TW)

(72) Inventor: Yung-Chi Lan, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/716,101

(22) Filed: Apr. 8, 2022

(65) Prior Publication Data

US 2023/0155582 A1 May 18, 2023

(30) Foreign Application Priority Data

Nov. 12, 2021 (TW) .................................. 110142159

(51) Int. Cl.
| | |
|---|---|
| G06F 1/04 | (2006.01) |
| H03K 5/1252 | (2006.01) |
| G06F 1/06 | (2006.01) |
| H03K 3/037 | (2006.01) |
| H03K 21/08 | (2006.01) |

(52) U.S. Cl.
CPC ............. *H03K 5/1252* (2013.01); *G06F 1/06* (2013.01); *H03K 3/037* (2013.01); *H03K 21/08* (2013.01)

(58) Field of Classification Search
CPC ...... H03K 3/037; H03K 5/125; H03K 5/1252; H03K 21/08; H03K 21/10; H03K 23/58; H03K 23/588; G06F 1/04; G06F 1/06; G06F 1/10; G06F 1/12
See application file for complete search history.

(56) References Cited

U.S. PATENT DOCUMENTS 11,487,317 B1 * 11/2022 Mohan ...................... H03K 5/00
2022/0247411 A1 * 8/2022 Lan ............................ G06F 1/08

* cited by examiner

*Primary Examiner* — Long Nguyen
(74) *Attorney, Agent, or Firm* — Muncy, Geissler, Olds & Lowe, P.C.

(57) ABSTRACT

A clock filter device for finding an optimal cut-off frequency of a clock filter through a controller to achieve an effective clock filtering is illustrated. Further, in the calibration mode, a reference clock that has not passed the clock filter and a reference clock that has passed the clock filter make a first counter and a second counter count respectively. After the first counter counts to a specific value, a count value of the second counter is obtained. The count values of the first counter and the second counter are compared to each other to determine whether the two values are approximate or not. When the two values are not approximate, the previous cut-off frequency of the clock filter is taken as the optimal cut-off frequency. Therefore, the clock filter can adopt the optimal cut-off frequency in a working mode to effectively filter out the noise an input clock.

14 Claims, 6 Drawing Sheets

CLOCK FILTER DEVICE, CLOCK FILTER AND PULSE GENERATOR

CROSS-REFERENCE TO RELATED APPLICATION

This application claims the priority from the TW Patent Application No. 110142159, filed on Nov. 12, 2021, and all contents of such TW Patent Application are included in the present disclosure.

BACKGROUND

1. Field of the Invention

The present disclosure relates to a filtering technology, in particular to, a clock filter device, a clock filter and a pulse generator that can dynamically adjust a cut-off frequency to effectively filter out the noise in the clock.

2. Description of the Related Art

In order to prevent the clock from generating glitches (which can be regarded as a kind of noise in the clock) due to unexpected reasons and causing the system to become unstable, usually, the clock will pass through a clock filter device (usually achieved by using a low-pass filter) to filter before the clock is supplied to the system, so that the glitches will not enter the system.

Figure 1:
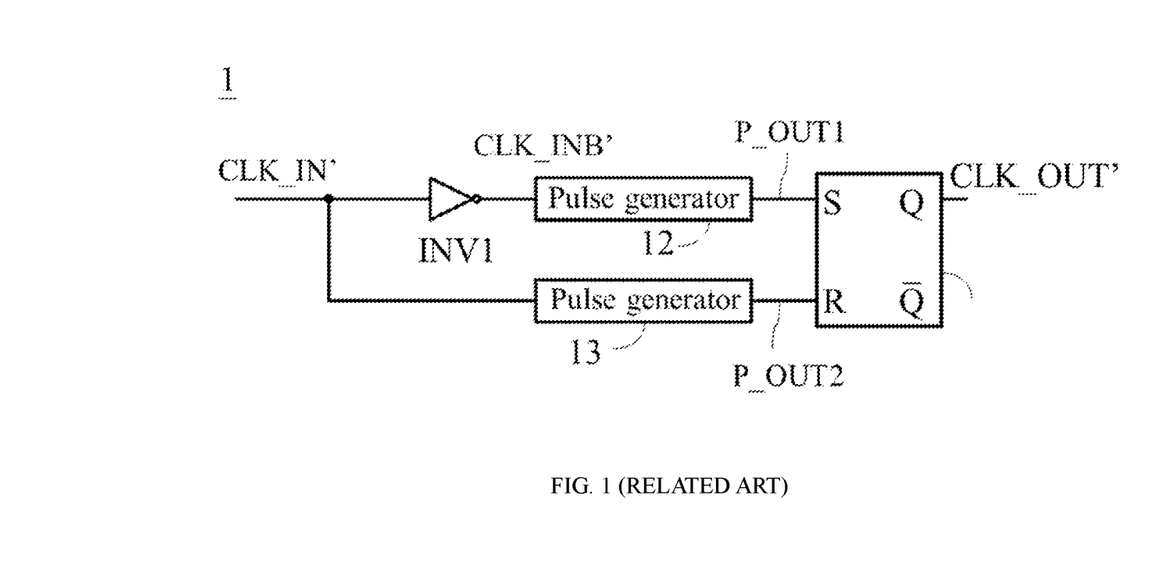
FIG. 1 is a block diagram of a clock filter device of the prior art.
Figure 2:
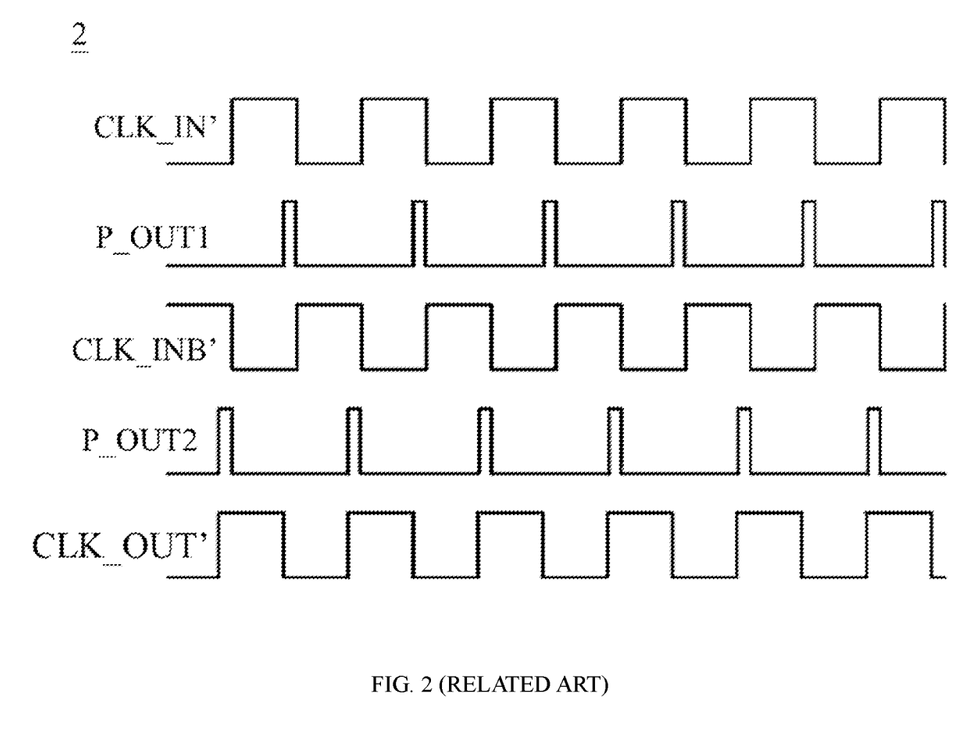
FIG. 2 is a waveform diagram of each signal of the clock filter device of the prior art in FIG. 1.

Referring to FIG. 1 and FIG. 2 at the same time, FIG. 1 is a block diagram of a clock filter device of the prior art, and FIG. 2 is the waveform diagram of each signal of the clock filter of the prior art shown in FIG. 1. The clock filter device 1 of the prior art comprises an inverted unit INV1, a pulse generators 12, 13, and a set-reset flip-flop (SR flip-flop) 14. The pulse generator 12 is electrically connected to the inverted unit INV1, and the set-reset flip-flop 14 is electrically connected to the pulse generators 12 and 13.

The inverted unit INV1 generates a clock CLB_INB' which is inverted from a clock CLK_IN'. The pulse generator 12 receives the clock CLK_IN' to generate a pulse signal P_OUT1, and the pulse generator 13 receives the clock CLK_INB' to generate a pulse signal P_OUT2. A set input terminal and a reset input terminal of the set-reset flip-flop 14 receive the pulse signals P_OUT1 and P_OUT2 respectively to generate a clock CLK_OUT' at the non-inverted output terminal.

When the frequency of the clock CLK_IN' is too high (higher than the cut-off frequency of the clock filter device 1 of the prior art), the pulse generators 12 and 13 cannot generate the pulse signals P_OUT1 and P_OUT2. Therefore, the clock CLK_OUT' of the non-inverted output terminal of the set-reset flip-flop cannot be transited (i.e. the clock CLK_OUT' maintains the same level). In other words, if there is a glitch (usually a high frequency) in the clock CLK_IN', the glitch will be filtered out by the clock filter device 1 of the prior art. Alternatively, when a hacker deliberately increases the frequency of the clock CLK_IN' to attack the chip, the clock CLK_IN' with increasing frequency will also be filtered out by the clock filter device 1 of the prior art.

The cut-off frequency of the clock filter device 1 of the prior art must make the clock CLK_IN' which allows the system worked to pass through, and to filter out the noise (such as glitches) in the clock CLK_IN'. Therefore, the cut-off frequency should be designed to be closed to but not less than the frequency of the clock CLK_IN' that allows the system worked. If the frequency of the clock CLK_IN' which allows the system worked is changed, the pulse widths of the pulse signals P_OUT1 and P_OUT2 output by the pulse generators 12 and 13 must be adjusted to change the cut-off frequency of the clock filter device 1 of the prior art.

Figure 3:
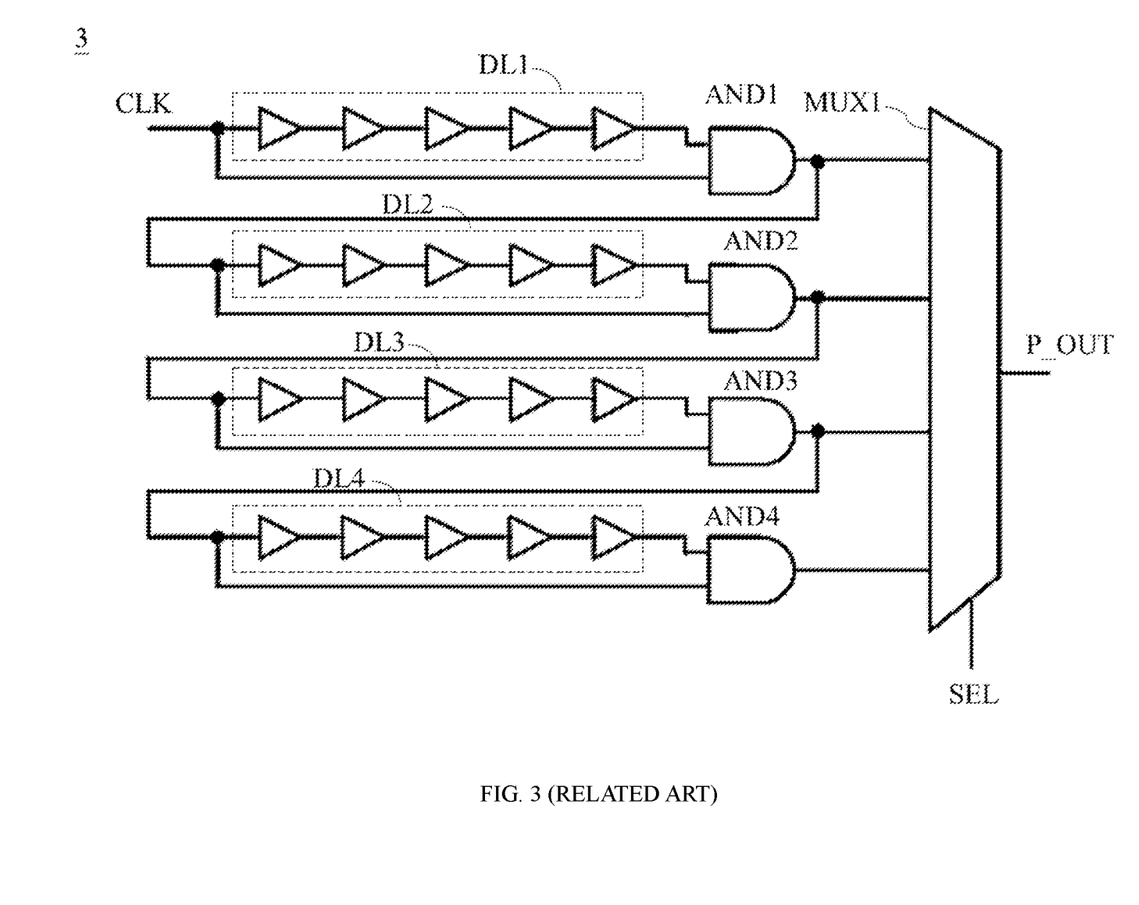
FIG. 3 is a block diagram of a pulse generator of the clock filter device of the prior art.

Referring to FIG. 1 and FIG. 3, FIG. 3 is block diagram of a pulse generator in the clock filter device of the prior art. The pulse generators 12 and 13 in the FIG. 1 can be realized by the pulse generator 3 in FIG. 3. The pulse generator 3 comprises a plurality of delay chains DL1 to DL4 (each of which is formed by connecting at least one delay unit in series), a plurality of AND gates AND1 to AND4 and a signal selector MUX1. After a clock CLK is processed by the delay chain DL1 and the AND gate AND1, a first pulse signal is generated. After the first pulse signal is processed by the delay chain DL2 and the AND gate AND2, a second pulse signal is generated. The second pulse signal is processed by the delay chain DL3 and the AND gate AND3, and a third pulse signal is then generated. The third pulse signal is processed by the delay chain DL4 and the AND gate AND4, and next, a fourth pulse signal is generated.

The signal selector MUX1 selects one of the first pulse signal, the second pulse signal, the third pulse signal and the fourth pulse signal as a pulse signal P_OUT output by the pulse generator 3 based on a selected signal SEL. Moreover, the pulse width of the first pulse signal is wider than the pulse width of the second pulse signal, the pulse width of the second pulse signal is wider than the pulse width of the third pulse signal, and the pulse width of the third pulse signal is wider than the pulse width of the fourth pulse signal.

The number of the delay chains DL1 to DL4 determines the number of the pulse widths of the pulse signals to be selected, and the selected pulse width also determines the cut-off frequency of the clock filter device 1 of the prior art. Hence, for the clock CLK of a specific frequency, the number of the delay units which passed through can be adjusted, so that the pulse width of the output pulse signal P_OUT can just make a clock CLK_OUT' of the output terminal of the set-reset flip-flop 14 transited. However, when the frequency of the clock CLK rises higher than the cut-off frequency (a specific frequency), the clock CLK_OUT' of the output terminal of the set-reset flip-flop 14 will not be transited.

Simply speaking, the method in FIG. 3 is to increase the number of the delay units in the pulse generators 12 and 13 to increase the adjustable range of the cut-off frequency of the clock filter device 1 of the prior art. However, when the adjustable range is wider, it means that the number of the delay units is larger. Since the power consumption is proportional to the number of the delay units, there is a technical problem of excessive power consumption if the pulse generator 3 in FIG. 3 adopts the clock filter device 1 of the prior art to adjust the cut-off frequency.

Furthermore, when the adjustable range of the cutoff frequency is wider, it is necessary to use a specific method to select an optimal cut-off frequency to filter out the noise in the clock effectively. On the other hand, since the clock filter device 1 of the prior art is affected by the process parameters, voltage and temperature, the cut-off frequency will be changed. Although the part of the process error is fixed at the factory and can be adjusted and compensated, in the event of a hacker attack, the hacker can still change the voltage and temperature of the clock filter device 1 of the prior art to make the cut-off frequency of the clock filter device 1 of the prior art drifted. Consequently, there is a need for a technical solution that can dynamically adjust the cut-off frequency to prevent the cut-off frequency from being drifted.

SUMMARY

One of the purposes of the present disclosure is to provide a clock filter device, which comprises a reference clock generator, a clock filter, a first counter, a second counter and a controller. The reference clock generator is configured to generate a first clock when the reference clock generator is enabled. The clock filter is electrically connected to the reference clock generator, and is configured to receive an input clock and a controlling signal, and filter the input clock to generate a second clock. Wherein, a cut-off frequency of the clock filter is controlled by the controlling signal, and the input clock is the first clock in a calibration mode. The first counter is electrically connected to the reference clock generator, and is configured to generate a first count value based on counting the first clock. The second counter is electrically connected to the clock filter, and is configured to generate a second count value based on counting the second clock. The controller is electrically connected to the reference clock generator, the first counter, the second counter and the clock filter. In the calibration mode, when the first count value counts to a first specific count value or the second count value counts to a second specific count value, the controller disables the reference clock generator, and then the controller generates the controlling signal according to whether an absolute difference value between the second count value and the first count value is less than or equal to a specific absolute difference value.

Correspondingly, an embodiment of the present disclosure also provides a pulse generator which does not need to use a plurality of delay chains, and a clock filter constructed by using the above pulse generator.

In conclusion, the clock filter device provided by the embodiment of the present disclosure can dynamically adjust the cut-off frequency, so that it can prevent the cut-off frequency from being affected by the process parameters, voltage and temperature of the. Moreover, the clock filter and the pulse generator provided by the embodiments of the present disclosure have the advantages of low power consumption and high safety.

In order to further understand the technology, means and effects of the present disclosure, reference may be made to the following detailed description and drawings, so that the purpose, features and concepts of the present disclosure can be thoroughly and concretely understood. However, the following detailed description and drawings are only used to reference and illustrate the implementations of the present disclosure, and they not used to limit the present disclosure.

BRIEF DESCRIPTION OF THE DRAWINGS

The accompanying drawings are provided to enable persons with ordinary knowledge in the technical field of the present disclosure to further understand the present disclosure, and are incorporated into and constitute a part of the specification of the present disclosure. The drawings illustrate exemplary embodiments of the present disclosure, and are used to explain the principle of the present disclosure together with the description of the present disclosure.

DESCRIPTION OF THE PREFERRED EMBODIMENTS

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

The present disclosure provides a technical solution that can dynamically adjust a cut-off frequency of a clock filter, so as to prevent hackers from attacking the system by adjusting the temperature and voltage to raise the cut-off frequency upward. A clock filter device of this technical solution is to find an optimal cut-off frequency of the clock filter through a controller in the calibration mode, so as to achieve an effective clock filtering. Furthermore, in the calibration mode, a reference clock (note: the reference clock is generated by the internal resistance-capacitance circuit of the clock filter device, so it can be served as the reference basis for clock adjustment) which has not passed the clock filter and the reference clock which passed the clock filter make a first counter and a second counter count respectively. A count value is obtained after the first counter counts to a first specific count value. Then, the count values of the first counter and the second counter are compared to each other to determine whether the two values are approximate or not, so as to adjust the cut-off frequency of the clock filter. When the count values of the two counters are not approximate, the previous cut-off frequency of the clock filter is taken as the optimal cut-off frequency, so that the clock filter can adopt the optimal cut-off frequency to filter out the noise of the clock effectively in the working mode. In another embodiment, it can be designed to the count value of the first counter is obtained after the second counter counts to a second specific count value. Then, the count values of the first counter and the second counter is compared to each other to determine whether the two values are approximate or not, such that the cut-off frequency can be adjusted accordingly. In an embodiment, the first specific count value may be the same as or different from the second specific count value.

Specifically, the clock filter is often applied to an input path of an external crystal oscillator to prevent glitches from being generated by noise from the external crystal oscillator. The clock filter can filter out the glitches and prevent the system from being affected by the glitches. A pin which leaks outside the chip is connected to the external crystal oscillator, so it is often the target of hacker attacks. However, through the technical solution, since the reference clock is generated by the internal resistance-capacitance circuit of the clock filter device. Therefore, the calibrated cut-off frequency of the clock filter is not changed by the external environment. Moreover, the present disclosure also provides a technical solution, which can adjust the cut-off frequency of the clock filter without depending on increasing and reducing the number of the delay units, so that the clock filter can have lower consumption than the manner of the prior art.

Figure 4:
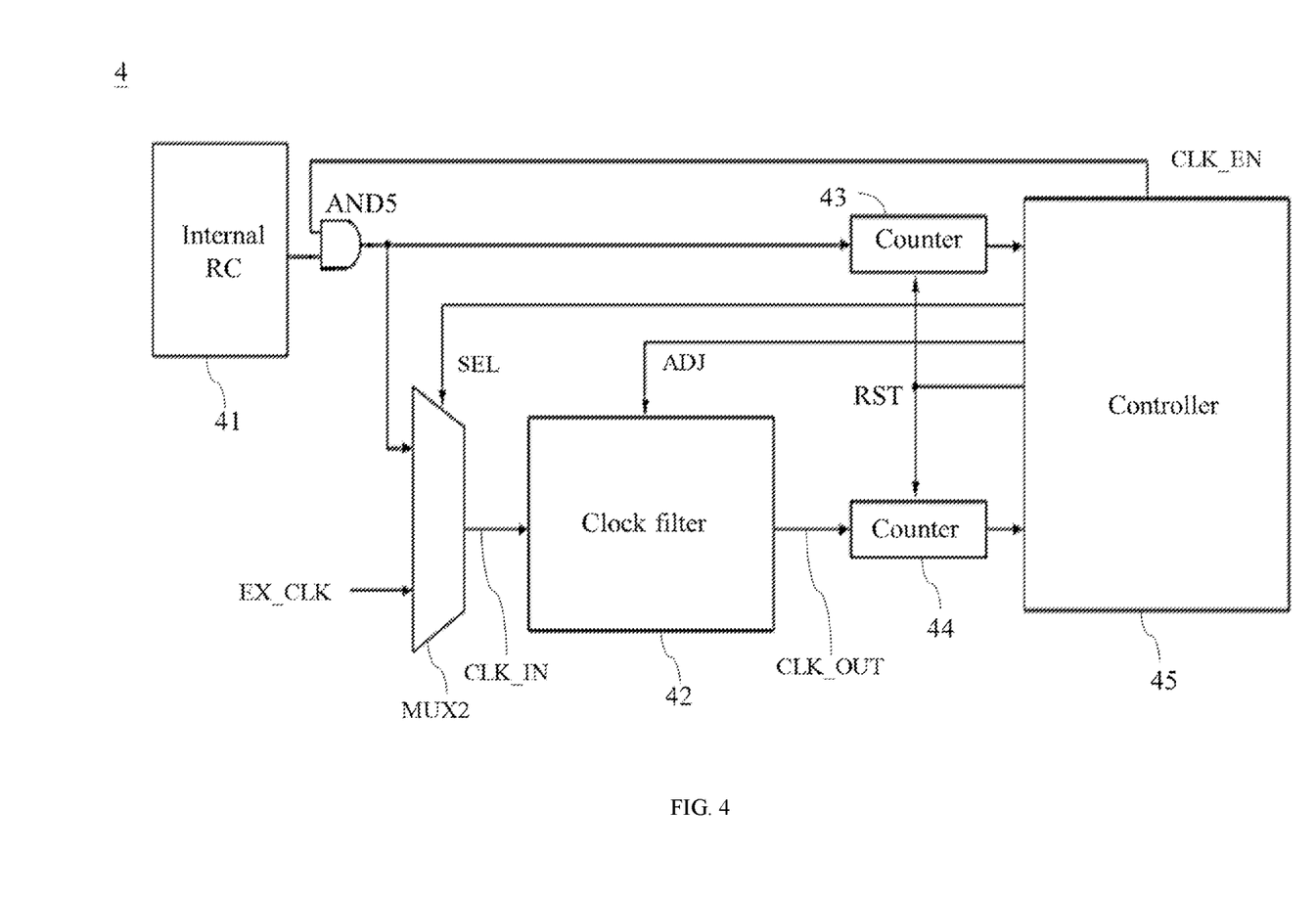
FIG. 4 is a block diagram of a clock filter device according to an embodiment of the present disclosure.

Firstly, referring to FIG. 4, FIG. 4 is a block diagram of a clock filter device according to an embodiment of the present disclosure. A clock filter device 4 can be implemented in a chip. The clock filter device 4 comprises a reference clock generator (comprises an internal resistance capacitance circuit 41 and an AND gate AND5), a clock filter 42, a signal selector MUX2, counters 43, 44 and a controller 45. The clock filter 42 is electrically connected to the reference clock generator through the signal selector MUX2. The counter 43 is electrically connected to the reference clock generator. The counter 44 is electrically connected to the clock filter 42. The controller 45 is electrically connected to the reference clock generator, the counters 43, 44 and the clock filter 42.

In a working mode, the controller 42 controls the signal selector MUX2 to select an external clock EX_CLK or a first clock (i.e. a reference clock generated by the internal resistance capacitance circuit 41) provided by the reference clock generator as an input clock CLK_IN of the clock filter 42 through a selecting signal SEL. That is, in the working mode, the clock filter 42 of the clock filter device 4 is allowed to filter out the selected external clock EX_CLK and the first clock generated by the clock generator according to the usage requirements of the system. The signal selector MUX2 can be realized by, for example, a multiplexer, and the present disclosure is not limited thereto.

The clock filter device 4 may enter the calibration mode periodically, or enter the calibration mode only when a specific event (such as an environmental temperature rise event or other hacker attack event) is activated. In the calibration mode, the controller 45 enables the reference clock generator to generate the first clock through an enable signal CLK_EN. The internal resistance-capacitance circuit 41 of the reference clock generator is electrically connected to the AND gate AND5 of the reference clock generator. The two input terminals of the AND gate AND5 receive the enable signal CLK_EN and the reference clock of the internal resistance-capacitance circuit 41 respectively. Hence, when the enable signal CLK_EN at a high logic level, the AND gate AND5 will input the reference clock as the first clock to the counter 43 and the signal selector MUX2. Actually, the AND gate AND5 is served as a switching circuit. In other embodiments, it can also be a simple switching transistor, and the present disclosure is not limited thereto.

The clock filter 42 is configured to receive the input clock CLK_IN and a controlling signal ADJ, and filter the input clock CLK_IN to generate a second clock CLK_OUT. The cut-off frequency of the clock filter 42 is controlled by the controlling signal ADJ. In the calibration mode, when the cut-off frequency of the clock filter 42 is adjusted, because only the reference clock generated by the internal resistance-capacitance circuit 41 can be trusted, the input clock CLK_IN of the clock filter 42 must be from the first clock of the reference clock generator. In the working mode, the input clock CLK_IN of the clock filter 42 can be the first clock or the external clock EX_CLK selected based on the selecting signal SEL (related to the system requirements). Preferably, the internal resistance-capacitance circuit 41 is designed to be insensitive to temperature, so as to avoid being affected by temperature and causing significant frequency drift.

When the counters 43 and 44 enter the calibration mode, they will reset first by a reset signal RST, and the clock filter 42 will also receive the controlling signal ADJ from the controller 45. The value of the controlling signal ADJ is an initial value which is usually the highest cut-off frequency of the corresponding clock filter 42. Then, after the counter 43 counts to a first specific value and the controller 45 generates the controlling signal ADJ to adjust the cut-off frequency of the clock filter 42 (i.e. after one calibration is completed), the counter 43 will also be reset by the rest signal RST. The counter 43 counts based on the first clock to generate a first count value. The counter 44 counts based on the second clock CLK_OUT to generate a second count value.

The controller 45 can be configured to generate the enable signal CLK_EN, the controlling signal ADJ, the selecting signal SEL and the reset signal RST. The controller 45 determines whether the first count value of the counter 43 reaches the first specific count value or not. If the first count value reaches the first specific count value, the controller 45 pulls the enable signal CLK_EN down to a low logic level to disable the reference clock generator to generate the reference clock as the first clock. Next, the controller 45 takes the second value of the second counter 44, and calculates whether an absolute difference value between the second value and the first value is less than or equal to a specific absolute difference value, and the controller 45 generates the controlling signal ADJ accordingly.

Concretely, considering that the reference clock of the internal resistance-capacitance circuit 41 is served as the input clock CLK_IN of the clock filter 42, and after being filtered by the clock filter 42, the reference clock of the clock filter 42 has become a clock of a different domain. In order to solve the delay problem across the clock domain, the controller 45 obtains the second count value and calculates the absolute difference value after the reference clock generator is disabled and then a first specific time is elapsed. The first specific time can be one or two clock cycles, and the present disclosure is not limited thereto. In other embodiments, the delay problem across clock domains may not be considered, the controller 45 directly obtains the second count value and calculates the absolute difference value without waiting.

In the calibration mode, when the absolute value is less than or equal to the specific absolute difference value, it means that the clock filter 42 has not completely filtered the reference clock generated by the internal resistance-capacitance circuit 41. Therefore, the controller 45 generates a controlling signal ADJ to lower the cut-off frequency of the clock filter, generates the reset signal REL to reset the counters 43 and 44, and re-enables the reference clock generator and clock filter device 4 to continue to operate in the calibration mode.

After performing the above-mentioned calibrations and comparisons several times, when the absolute difference value is greater than the specific absolute difference value, it means that the clock filter 42 completely filters out the reference clock generated by the internal resistance-capacitance circuit 41. As a result, the controller 45 takes the previous controlling signal ADJ to set the cut-off frequency of the clock filter 42 and the controls the clock filter device 4 to end the calibration mode and enter the working mode.

In the working mode, the input clock CLK_IN usually selects the external clock EX_CLK. Hence, the frequency of the reference clock generated by the internal resistance-capacitance circuit 41 is usually designed to be the same as the frequency of the external clock EX_CLK, so that the design is relatively simple. Therefore, the clock filter 42 takes the cut-off frequency corresponding to the controlling signal ADJ of the penultimate calibration operation in the calibration mode to filter the input clock CLK_IN. However, the present disclosure is not limited to this. If the cut-off frequency of the clock filter 42 can be adjusted linearly, when the frequency of the reference clock generated by the internal resistance-capacitance circuit 41 is different from the frequency of the external clock EX_CLK, based on the multiple relationship between the frequencies of the external clock EX_CLK and the reference clock generated by the internal resistance-capacitance circuit 41, the controlling signal ADJ of the penultimate calibration operation in the calibration mode is converted to set the cut-off frequency of the clock filter 42 suitable for the frequency of the external clock EX_CLK.

Incidentally, the bit width of the counters 43 and 44 need to be designed to is consider the following conditions. For example, whether an adjusted value of the cut-off frequency will just fall within the critical value between filtering out and not filtering out, or whether the clock filter 42 may filter erroneously the input clock CLK_IN at least once during multiple filtering. Because the above-mentioned conditions may cause performance of the system to deteriorate, and even the second count value output by the counter 44 is wrong due to the missing input clock CLK_IN, the counters 43 and 44 with more bits are usually used to observe the filtering conditions for several times to ensure that the input clock CLK_IN input continuously passes the clock filter 42 successfully before the cut-off frequency reaches the filter frequency.

In an embodiment of the present disclosure, the clock filter 42 can adopt the clock filter structured and implemented by the pulse generator 3 in FIG. 3, or the clock filter 42 can also be other types of clock filters, and the present disclosure is not limit thereby. In one of the embodiments, the controlling signal ADJ is configured to control a delay time of the input clock CLK_IN to the clock filter 42 to determine the cut-off frequency of the clock filter 42. In other embodiments, the delay time may be relative to an operating voltage of the clock filter 42, and the controlling signal ADJ can be configured to control the operating voltage.

It should be noted that in another embodiment, it can be designed that the counter 44 counts to the second specific count value. The controller 45 pulls the enable signal CLK_EN to a low logic level to disable the reference clock generator to generate the reference clock as the first clock. Next, the controller 45 takes the first count value of the counter 43, and calculates the absolute difference value between the second value and the first value is less than or equal to the specific absolute difference value, and the controlling signal ADJ is generated accordingly. Moreover, the controller 45 obtains the first count value and calculates the absolute difference value after the reference clock generator is disabled and a second specific time is elapsed. The second specific time can be one or two cycles, and the present disclosure is not limited thereby. The first specific count value can be the same or different from the second specific count value, and the first specific time can be the same or different from the second specific time. In fact, the design depends on the user's situation. As long as make sure that the count values of the counter 43 and 44 before being taken out by the controller 45, there is no overflow problem.

Figure 5:
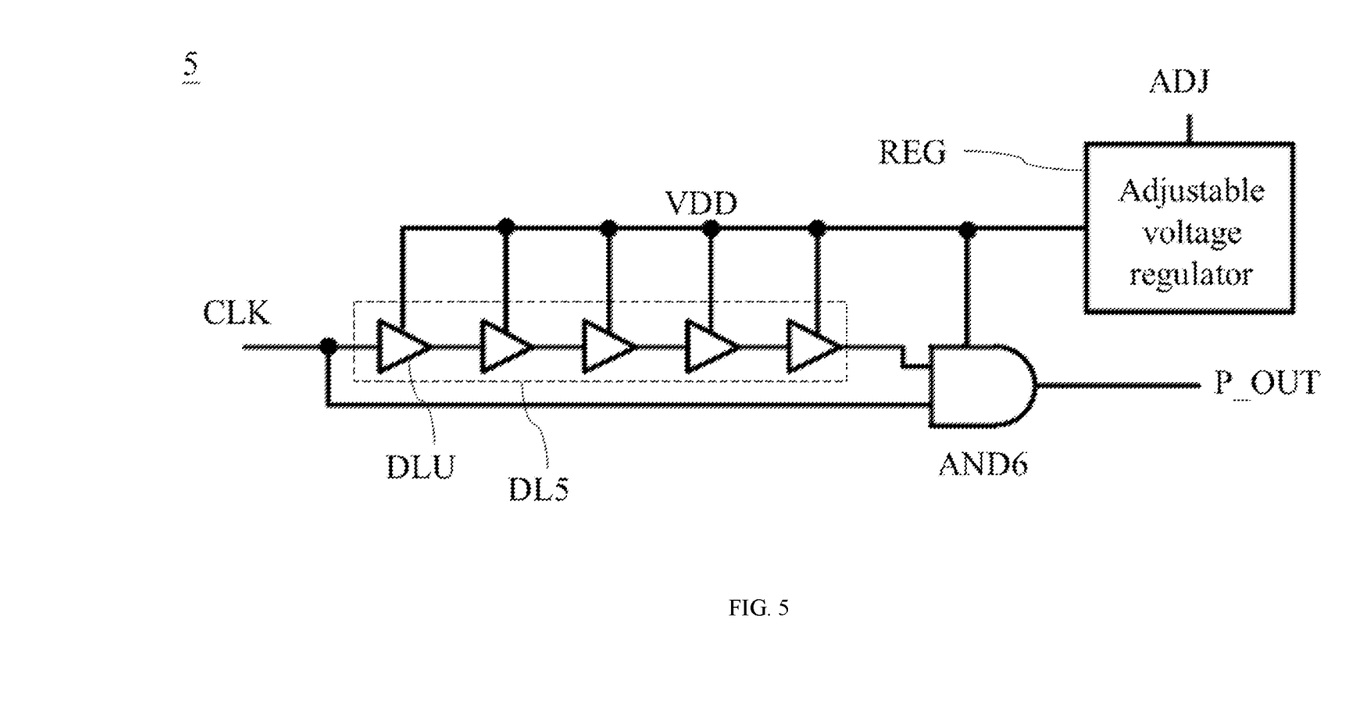
FIG. 5 is a block diagram of a pulse generator in the clock filter device according to an embodiment of the present disclosure.

Referring to FIG. 5, FIG. 5 is a block diagram of a pulse generator in the clock filter device of the present disclosure. The clock filter 42 can adopt the clock filter structured and implemented by the pulse generator 5 in FIG. 5. The pulse generator 5 comprises an adjustable voltage regulator REG, a delay chain DL5 formed by a series of several delay units DLU and a logic circuit (implemented by an AND gate AND6, but the present disclosure is not limited thereby). The delay chain DL5 is electrically connected to the adjustable voltage regulator REG, and the logic circuit is electrically connected to the delay chain DL5.

The adjustable voltage regulator REG receives the controlling signal ADJ, and generates an operating voltage VDD according to the controlling signal ADJ to the delay unit DLU and the logic circuit. The delay chain DL5 is configured to delay the clock CLK for a delay time to generate a delay clock. The logic circuit is configured to generate a pulse P_OUT according to the clock CLK and the delay clock. The individual delay time of each of the delay unit DLU and the logic circuit are controlled by the operating voltage. Therefore, the delay time of the clock CLK passing through the delay chain DL5 is related to the operating voltage VDD determined by the controlling signal ADJ, and the delay time of the clock CLK passing through the delay chain DL5 will affect the cut-off frequency of the clock filter structured and implemented by the pulse generator 5 in FIG. 5.

Different from the manner of the prior art, the pulse generator 5 in FIG. 5 does not need to use a very large number of delay chains. As a result, the number of the delay units DLU is also greatly reduced, so that power consumption and chip area can be reduced accordingly. Additionally, the adjustable voltage regulator REG can be select from a high-efficiency regulator with low-energy consumption to further increase the power-saving performance of the circuit. Since the adjustable voltage regulator REG has low power consumption and is only provided to a small number of digital circuit (the delay units DLU and the AND gate AND6), there is no need for external capacitors for voltage stabilization, so no pins of external capacitors are exposed. Consequently, compared to the conventional manner, hackers cannot change the cut-off frequency by applying voltage to the pins of the capacitors that are exposed outside the chip, and the security is also improved.

Figure 6:
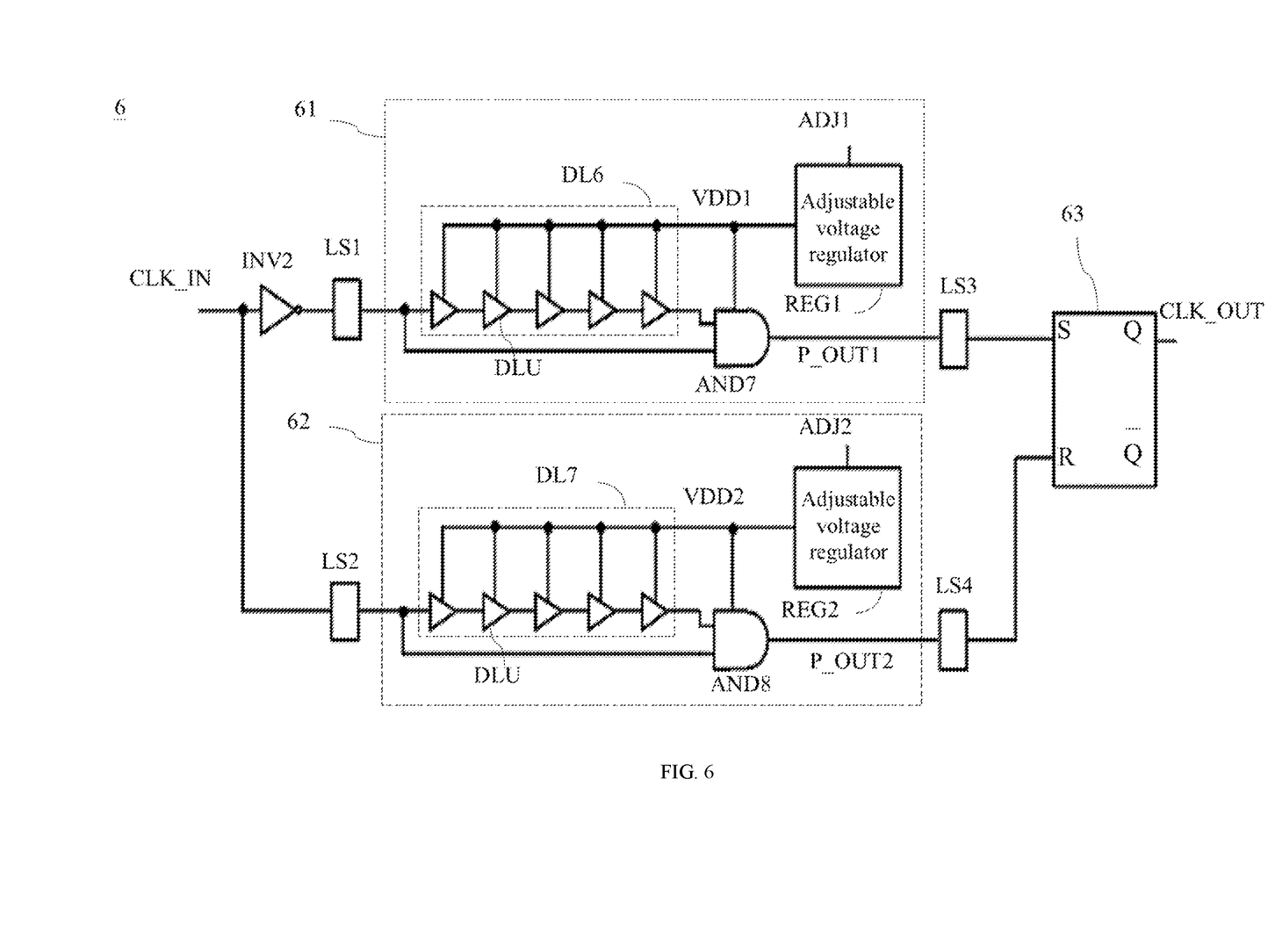
FIG. 6 is a block diagram of a pulse generator in the clock filter device according to an embodiment of the present disclosure.

Then, referring to FIG. 6, FIG. 6 is a block diagram of a clock filter in the clock filter device of the present disclosure. The clock filter structured and implemented by the pulse generator 5 in FIG. 5 can be the same as the clock filter 6 in FIG. 6. The clock filter 6 comprises an inverting unit INV2, level shifters LS1 to LS4 and a flip-flop (implemented by a set-reset flip-flop (SR flip-flop) 63, but the present disclosure is not limited thereby). The pulse generators 61 and 62 have the same structure as the pulse generator 5 in FIG. 5, so the content already described will be omitted appropriately below. The level shifter LS1 is electrically connected between the inverting unit INV2 and the pulse generator 61. The level shifter LS2 is electrically connected between the input clock CLK_IN and the pulse generator 62. The level shifter LS3 is electrically connected between a first input terminal of the flip-flop (a set input terminal of the set-reset flip-flop 63) and the pulse generator 63. The level shifter LS4 is electrically connected between the second input terminal of a second terminal (the reset input terminal of the set-reset flip-flop 63) and the pulse generator 62.

The inverting unit INV2 generates the inverted input clock of the input clock CLK_IN. An adjustable voltage regulator REG1 of the pulse generator 61 generates a first operating voltage VDD1 according to the first controlling signal ADJ1 to a delay chain DLU6 and an AND gate AND7. Moreover, the AND gate AND7 is configured to generate a pulse signal P_OUT1 according to the inverted input clock and a delayed inverted input clock. An adjustable voltage regulator REG2 of the pulse generator 62 generates a second operating voltage VDD2 according to a second controlling signal ADJ2 to a delay chain DLU7 and an AND gate AND8. Moreover, the AND gate AND8 is configured to generate a pulse signal P_OUT2 according to the input clock and the delayed input clock. The set input terminal and the reset input terminal of the set-reset flip-flop 63 receive the pulse signals P_OUT1 and P_OUT2 respectively to generate a second clock CLK_OUT at its non-inverting input terminal.

Although in this embodiment, the first operating voltage VDD1 and the second operating voltage VDD2 are provided by the adjustable voltage regulator REG1 and REG2, the present disclosure is not limited thereto. The above method takes the error of the manufacturing process into consideration, so the two adjustable voltage regulators REG1 and REG2 are adopted. If the process error is not large, it can be designed to share one adjustable voltage regulator. That is, the two adjustable voltage regulators REG1 and REG2 are the same adjustable voltage regulator, and the first controlling signal ADJ1 and the second controlling signal ADJ2 are the same as each other.

As stated above, the clock filter device provided by the embodiments of the present disclosure can dynamically adjust the cut-off frequency so that the cut-off frequency can be prevented from being affected by process parameters, voltage and temperature of the. Particularly, the clock filter device can prevent hackers from drafting the cut-off frequency by changing the voltage and temperature. On the other hand, the clock filter of the clock filter device can be designed as that the cut-off frequency is related to the operating voltage. Moreover, the adjustable voltage regulator is only allowed to provide the operating voltage to a small number of digital circuits of the clock filter, so as to form a capacitor-less circuit structure. In this way, the clock filter does not need to have the design of exposing the pins of the external capacitor, and can avoid providing the path of the input attack voltage to hackers, so it can increase the security of the system.

It should be understood that the examples and embodiments described herein are for illustrative purpose only, and various modification or change in view of them will be suggested to those skilled in the art, and will be included in the spirit and scope of this application and the appendix within the scope of the claims.

What is claimed is:

1. A clock filter device, comprising:
   a reference clock generator, configured to generate a first clock when the reference clock generator is enabled;
   a clock filter, electrically connected to the reference clock generator, and configured to receive an input clock and a controlling signal, and filter the input clock to generate a second clock, wherein the a cut-off frequency of the clock filter is controlled by the controlling signal, and the input clock is the first clock in a calibration mode;
   a first counter, electrically connected to the reference clock generator and configured to generate a first count value based on counting the first clock;
   a second counter, electrically connected to the clock filter and configured to generate a second count value based on counting the second clock; and
   a controller, electrically connected to the reference clock generator, the first counter, the second counter and the clock filter, wherein in the calibration mode, when the first count value reaches a first specific count value or the second count value reaches a second specific count value, the controller disables the reference clock generator, and then the controller generates the controlling signal according to whether an absolute difference value between the second count value and the first count value is less than or equal to a specific absolute difference value;
   wherein the controlling signal controls a delay time which the input clock delays in the clock filter to the input clock to determine the cut-off frequency of the clock filter.

2. The clock filter device according to claim 1, wherein in the calibration mode:
   when the absolute difference value is less than or equal to the specific absolute difference value, the controller generates the controlling signal to decrease the cut-off frequency of the clock filter, resets the first counter and the second counter, and re-enables the reference clock generator and makes the clock filter operate continuously in the calibration mode; and
   when the absolute difference value is not less than or equal to the specific absolute difference value, the controller uses the previous controlling signal to set the cut-off frequency of the clock filter, and controls the clock filter device to end the calibration mode and enters a working mode.

3. The clock filter device according to claim 2, wherein in the working mode, the input clock is an external clock or the first clock.

4. The clock filter device according to claim 1, wherein the controller obtains the second count value and calculates the absolute difference value after the first count value reaches the first specific count value and then a first specific time is elapsed; or the controller obtains the first count value and calculate the absolute difference value after the second count value reaches the second specific count value and then a second specific time is elapsed.

5. The clock filter device according to claim 1, wherein the reference clock generator comprises:
   an internal resistance-capacitance circuit, configured to generate a reference clock; and
   a switch circuit, electrically connected to the internal resistance-capacitance circuit, the controller and the first counter, and configured to receive the reference clock and an enable signal generated by the controller, so as to make the reference clock be provided as the first clock when the reference clock generator is enabled.

6. The clock filter device according to claim 1, further comprising:
   a signal selector, electrically connected to the reference clock generator, the controller and the clock filter, and configured to select an external clock or the first clock served as the input clock of the clock filter based on a selecting signal generated by the controller.

7. The clock filter device according to claim 1, wherein the delay time is related to an operating voltage of the clock filter, and the controlling signal controls the operating voltage.

8. The clock filter device according to claim 1, wherein the clock filter comprises:
   an inverting unit, configured to generate an inverted input clock of the input clock;

a first pulse generator, electrically connected to the inverting unit, and configured to delay the inverted input clock by a first delay time to generate a delayed inverted input clock, and generate a first pulse based on the inverted input clock and the delayed inverted input clock, wherein a first operating voltage of the first pulse generator is related to a first controlling signal of the controlling signal of the controller, and the first delay time is controlled by the first operating voltage;

a second pulse generator, configured to delay the input clock by a second delay time to generate a delayed input clock, and generate a second pulse based on the input clock and the delayed input clock, wherein a second operating voltage of the second pulse generator is related to a second controlling signal of the controller, and the second delay time is controlled by the second operating voltage; and a flip-flop, electrically connected to the first pulse generator and the second pulse generator, having a first input terminal configured to receive the first pulse, and a second input terminal configured to receive the second pulse, and configured to generate the second clock at an output terminal of the flip-flop based on the first pulse and second pulse.

9. The clock filter device according to claim 8, wherein the first pulse generator comprises:

a first adjustable voltage regulator, configured to receive the first controlling signal to generate the first operating voltage;

a first delay chain, electrically connected to the first adjustable voltage regulator, comprising a first delay unit configured to delay the inverted input clock by the first delay time, and generate the delayed inverted input clock; and a first logic circuit, electrically connected to the first delay chain and configured to generate the first pulse based on the inverted input clock and the delayed inverted input clock;

wherein the first delay unit and the first logic circuit receive the first operating voltage, and an individual delay time of each of the first delay unit and the first logic circuit is controlled by the first operating voltage.

10. The clock filter device according to claim 9, wherein the second pulse generator comprises:

a second adjustable voltage regulator, configured to receive the second controlling signal to generate the second operating voltage;

a second delay chain, electrically connected to the second adjustable voltage regulator, comprising a second delay unit, and the second delay unit is configured to delay the input clock by the second delay time, and generate the delayed input clock; and a second logic circuit, electrically connected to the second delay chain and configured to generate the second pulse based on the input clock and the delayed input clock;

wherein the second delay unit and the second logic circuit receive the second operating voltage, and an individual delay time of each of the second delay unit and the second logic circuit is controlled by the first operating voltage.

11. The clock filter device according to claim 10, wherein the second operating voltage is the first operating voltage, and the second controlling signal is the first controlling signal.

12. The clock filter device according to claim 11, wherein the second adjustable voltage regulator is the first adjustable voltage regulator.

13. The clock filter device according to claim 8, further comprising:

a first level shifter, electrically connected between the inverting unit and the first pulse generator;

a second level shifter, electrically connected between the input clock and the second pulse generator;

a third level shifter, electrically connected between the first input terminal of the flip-flop and the first pulse generator; and a fourth level shifter, electrically connected between the second input terminal of the flip-flop and the second pulse generator.

14. The clock filter device according to claim 1, further comprising a pulse generator used in the clock filter, the pulse generator comprising:

an adjustable voltage regulator, configured to receive a controlling signal to generate an operating voltage;

a delay chain, electrically connected to the adjustable voltage regulator, comprising a delay unit, and the delay unit is configured to delay the clock by the delay time, and generate a delayed clock; and a logic circuit, electrically connected the delay chain, and configured to generate a pulse based on the clock and the delayed clock;

wherein the delay unit and the logic circuit receive the operating voltage, and an individual delay time of each of the delay unit and the logic circuit is controlled by the operating voltage.

* * * * *